United States Patent
Ziari et al.

(10) Patent No.: US 6,525,872 B1
(45) Date of Patent: Feb. 25, 2003

(54) FIBER GRATING-STABILIZED, SEMICONDUCTOR PUMP SOURCE

(75) Inventors: Mehrdad Ziari, Pleasanton, CA (US);
Stephen O'Brien, Orefield, PA (US);
Mats Hagberg, Västra Frölunda (SE);
Robert J. Lang, Pleasanton, CA (US);
Edward Vail, Menlo Park, CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/375,687

(22) Filed: Aug. 17, 1999

Related U.S. Application Data

(63) Continuation-in-part of application No. 09/313,741, filed on May 18, 1999.
(60) Provisional application No. 60/120,012, filed on Feb. 11, 1999, and provisional application No. 60/129,905, filed on Apr. 16, 1999.

(51) Int. Cl.⁷ .................................. H01S 3/00
(52) U.S. Cl. ................. 359/341.3; 359/341.1
(58) Field of Search ................ 359/341.1, 341.3; 372/6

(56) References Cited

U.S. PATENT DOCUMENTS

| | | |
|---|---|---|
| 4,063,106 A | 12/1977 | Ashkin et al. |
| 5,321,718 A | 6/1994 | Waarts et al. |
| 5,323,404 A | 6/1994 | Grubb |
| 5,392,308 A | 2/1995 | Welch et al. |
| 5,485,481 A | 1/1996 | Ventrudo et al. |
| 5,537,432 A | 7/1996 | Mehuys et al. |
| 5,563,732 A | 10/1996 | Erdogan et al. |
| 5,715,263 A | 2/1998 | Ventrudo et al. |
| 5,721,636 A | 2/1998 | Erdogan et al. |
| 5,778,014 A | 7/1998 | Islam |
| 5,790,576 A | 8/1998 | Waarts et al. |
| 5,799,024 A | 8/1998 | Bowers et al. |
| 5,841,797 A | 11/1998 | Ventrudo et al. |
| 5,870,417 A | 2/1999 | Verdiell et al. |

OTHER PUBLICATIONS

O'Brien S. et al., 1W CW Single Frequency, Diffraction–Limited Unstable Resonator Semiconductor Laser with Distributed Bragg Reflector Mirrors, Electronics Letters, GB, IEE Stevenage, vol. 31, No. 3 Feb. 2, 1995, pp. 203–205.
Lu B. et al., 400mW Continuous–Wave Diffraction Limited Flared Unstable Resonator Laser Diode at 635nm, Electronics Letters, GB, IEE Stevenage, vol. 33, No. 19, Sep. 11, 1997 pp. 1633–1634.
Kim I S et al., Coherence–Collapsed 1.3.um Multimode Laser Diode for the Fiber–Optics Gyroscope, Letters, US, Optical Society of America, Washington, vol. 20, No. 7, Apr. 1, 1995 pp. 731–733.

(List continued on next page.)

Primary Examiner—Mark Hellner
(74) Attorney, Agent, or Firm—Allen, Dyer, Doppelt, Milbrath & Gilchrist, P.A.

(57) ABSTRACT

High power semiconductor lasers for pumping fiber devices, such as fiber amplifiers and fiber lasers, include an optical gain region disposed between a rear end and the output end, the width of the optical gain region being greater at the output end than at the rear end. The optical gain region may include a single mode channel region coupled to a flared amplifier region. The light output from the laser is coupled via a lens system into a fiber for propagating to the fiber device to be pumped. Light is fedback into the laser, for example from a fiber Bragg grating, to induce the laser to operate in coherence collapse. The broad bandwidth output associated with coherence collapse permits the laser to deliver high optical powers into the fiber without the onset of stimulated Billion scattering. Fiber grating feedback improves the quality of the beam output by the laser, thus enhancing coupling efficiency into the fiber. The pump laser may be used to pump multiple fiber devices. Multiple pump lasers may be combined together.

59 Claims, 10 Drawing Sheets

OTHER PUBLICATIONS

Mathur, et al., "Very High Power 1.48μm Semiconductor Lasers", *Electronic Letters*, vol. 35, No. 12, pp. 983–985, Jun. 10, 1999.

Donnelly, et al. "High–Power 1.5μm Tapered–Gain–Region Lasers", SPIE, vol. 3284, pp. 54–62, 1998.

Wong, et al., "High–power, Diffraction–limited InGaAsP Flared Unstable Resonators at 840nm", *1997 Digest of the LEOS Summer Topical Meetings*, pp. 74–75, Aug. 1997.

Groves, et al., "Strained–Layer InGaAsP Diode Lasers with Tapered Gain Region for Operation at λ–1.3μm", *IEEE Photonics Technology Letters*, vol. 6, No. 11, pp. 1286–1288, Nov. 1994.

Walpole, et al., "Diffraction–Limited 1.3μm–Wavelength Tapered–Gain–Region Laser With > 1–W Output Power", *IEEE Photonics Technology Letters*, vol. 8, No. 11, pp. 1429–1431, Nov. 1996.

Cho, et al., "1.9–W Quasi–CW from a Near–Diffraction–Limited 1.55–μm InGaAsP–InP Tapered Laser", *IEEE Photonics Technology Letters*, vol. 10, No. 8, pp. 1091–1093, Aug. 1998.

Donnelly, et al., "1.5μm Tapered–Gain–Region Lasers with High–CW Output Powers" *IEEE Photonics Technology Letters*, vol. 10, No. 10, pp. 1377–1379, Oct. 1998.

Dagenais, et al., "High–Power Flared Semiconductor Laser Amplifiers", *SPIE, Optoelectronic Integrated Circuit Materials, Physics, and Devices*, vol. 2397, pp. 47–58, Feb. 1995.

Yeh, et al., "Angled–Facet High–Power Diffraction–Limited Tapered Semiconductor Amplifier", *LEOS 7th Annual Meeting, IEEE Lasers and Electro–Optics Society 1994 Annual Meeting*, pp. 399–400, Oct. 1994.

Lang, et al., "Spontaneous Filamentation in Broad–Area Diode Laser Amplifiers", *IEEE Journal of Quantum Electronics*, vol. 30, No. 3, pp. 685–694, Mar. 1994.

Delepine, et al., "370mW coupled into singlemode optical fibre from 1.48μm unstable cavity laser", *Electronics Letters*, vol. 35, No. 2, Jan. 21, 1999.

Salet, et al., "1.1–W Continuous–Wave 1480–nm Semiconductor Lasers with Distributed Electrodes for Mode Shaping", *IEEE Photonics Technology Letters*, vol. 10, No. 12, pp. 1706–1708, Dec. 1998.

Mathur, et al, "High power grating stabilized 1480 nm flared semiconductor pump laser", *10th Optical Amplifiers and Their Applications*, pp. 263–266, Jun. 1999.

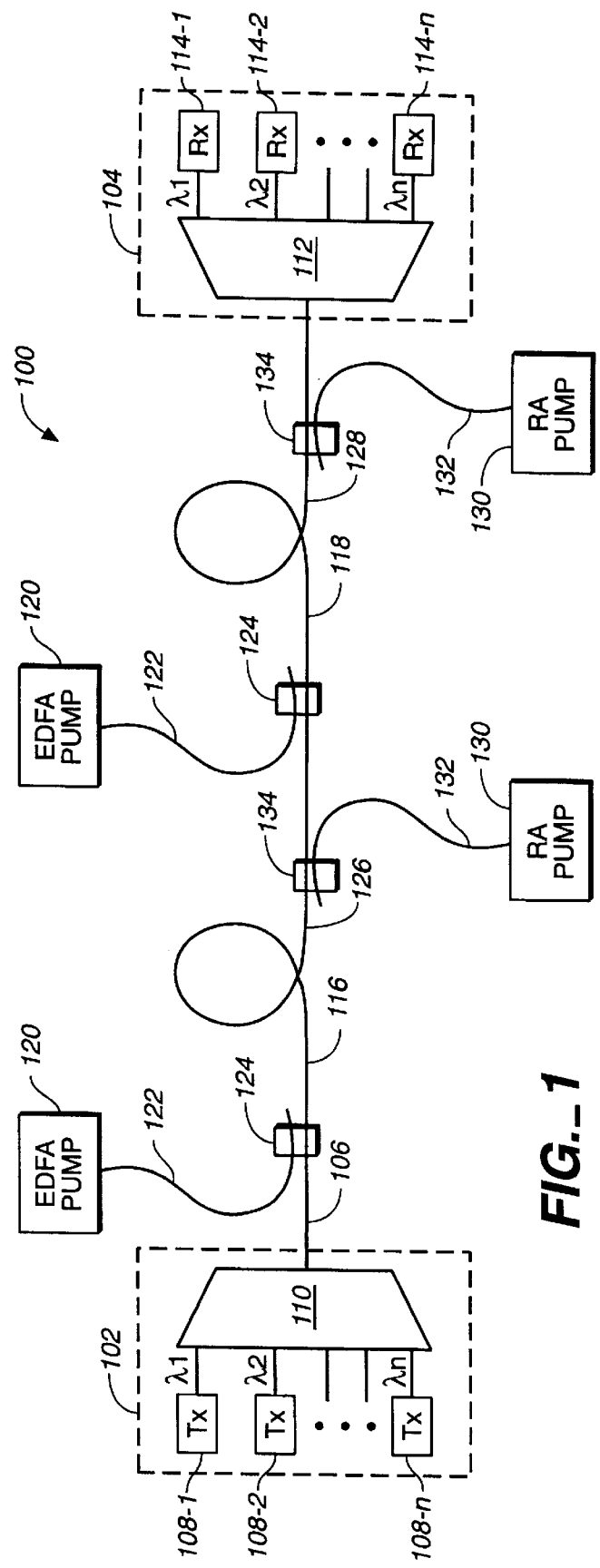
FIG._1

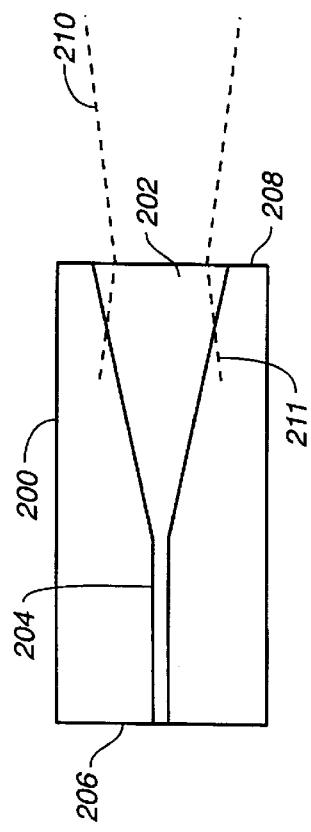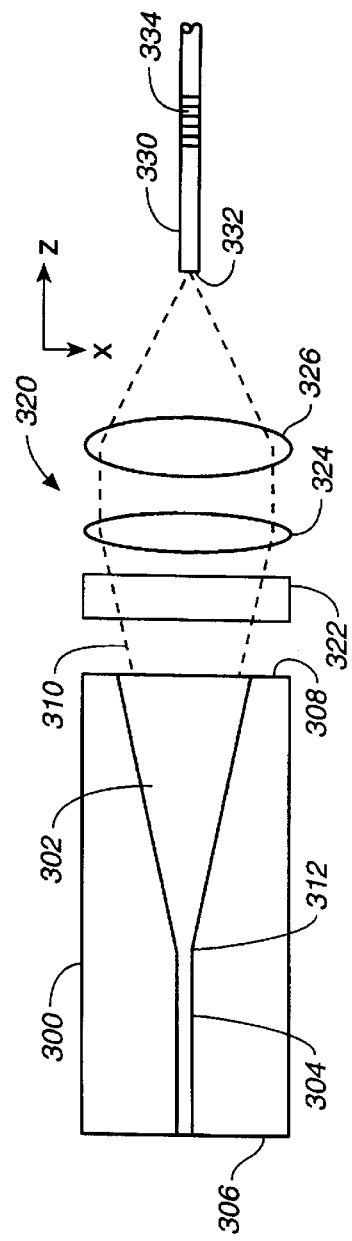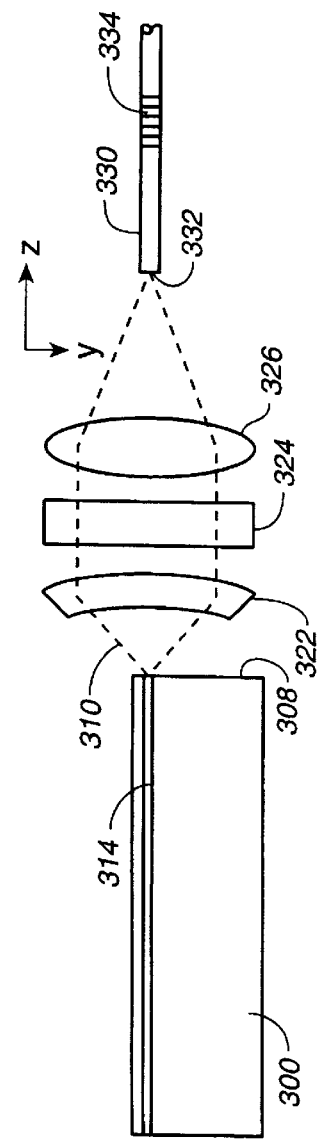
FIG._2 (PRIOR ART)
FIG._3A
FIG._3B

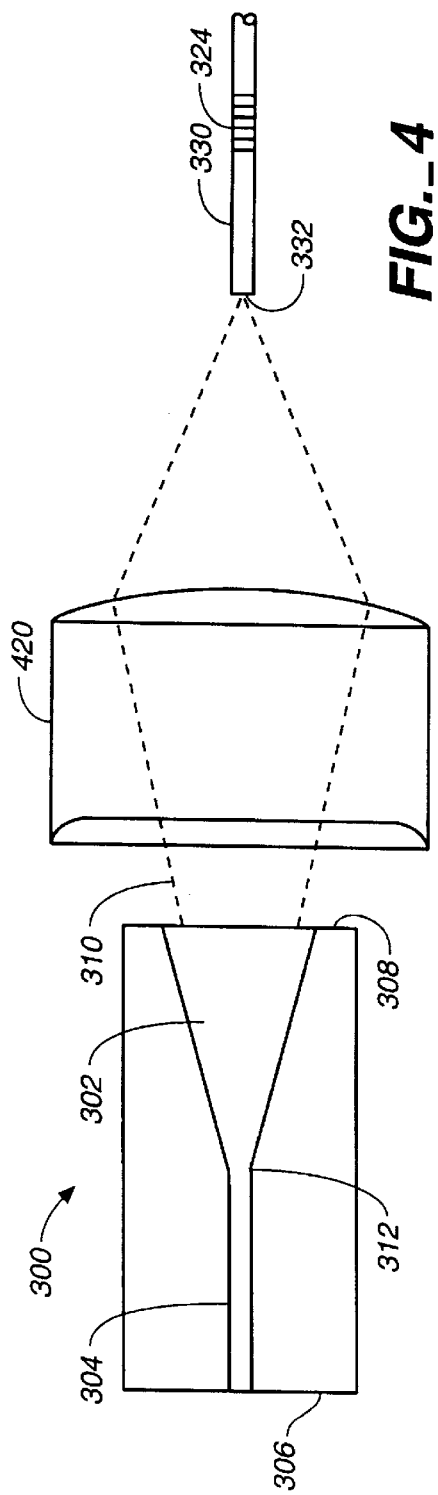
FIG._4
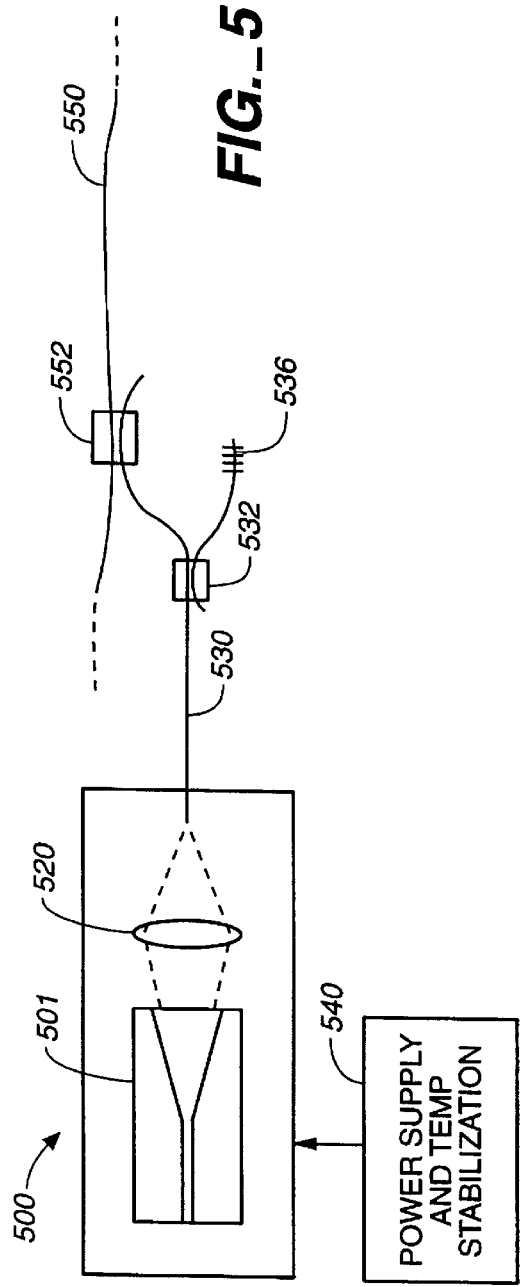
FIG._5

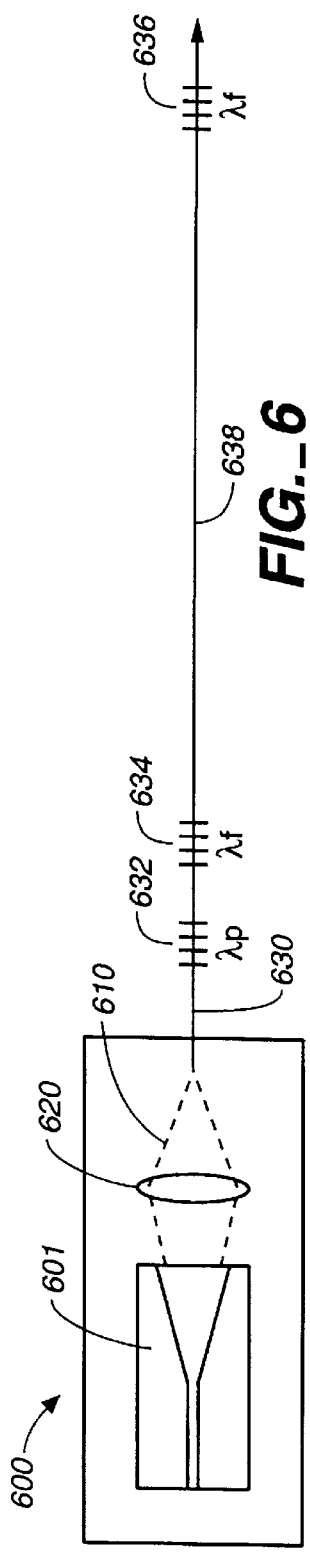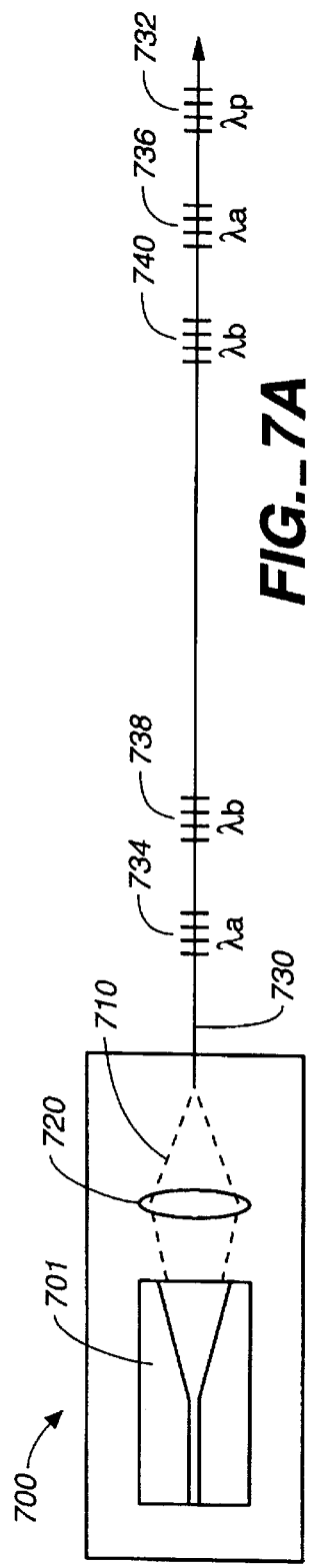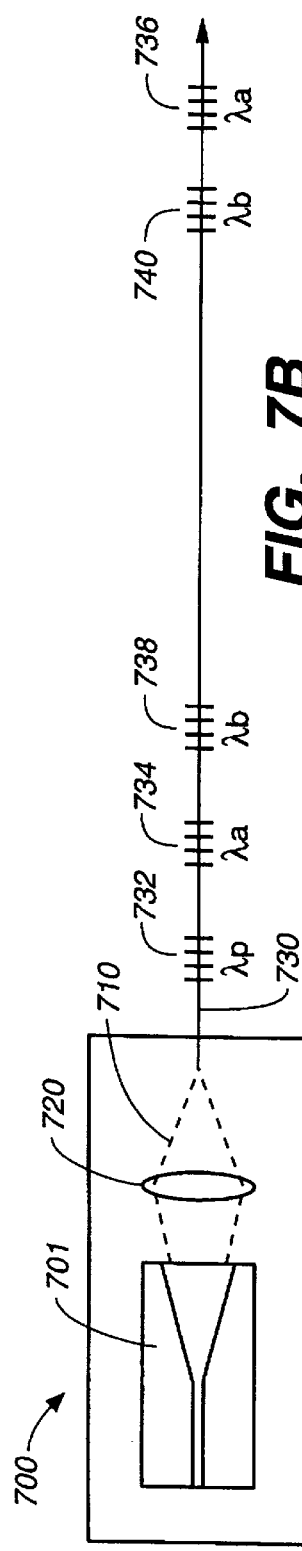

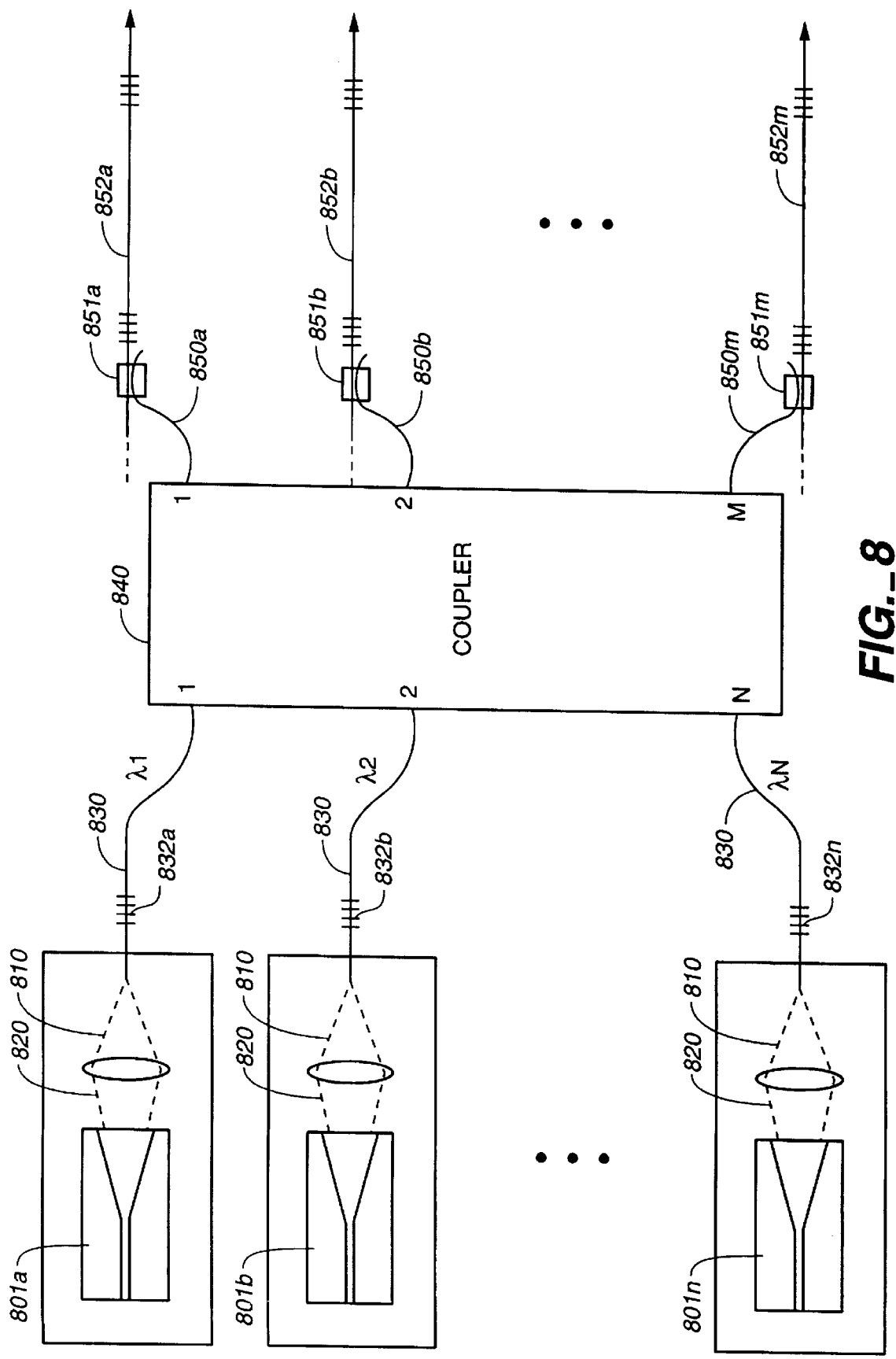
FIG._8

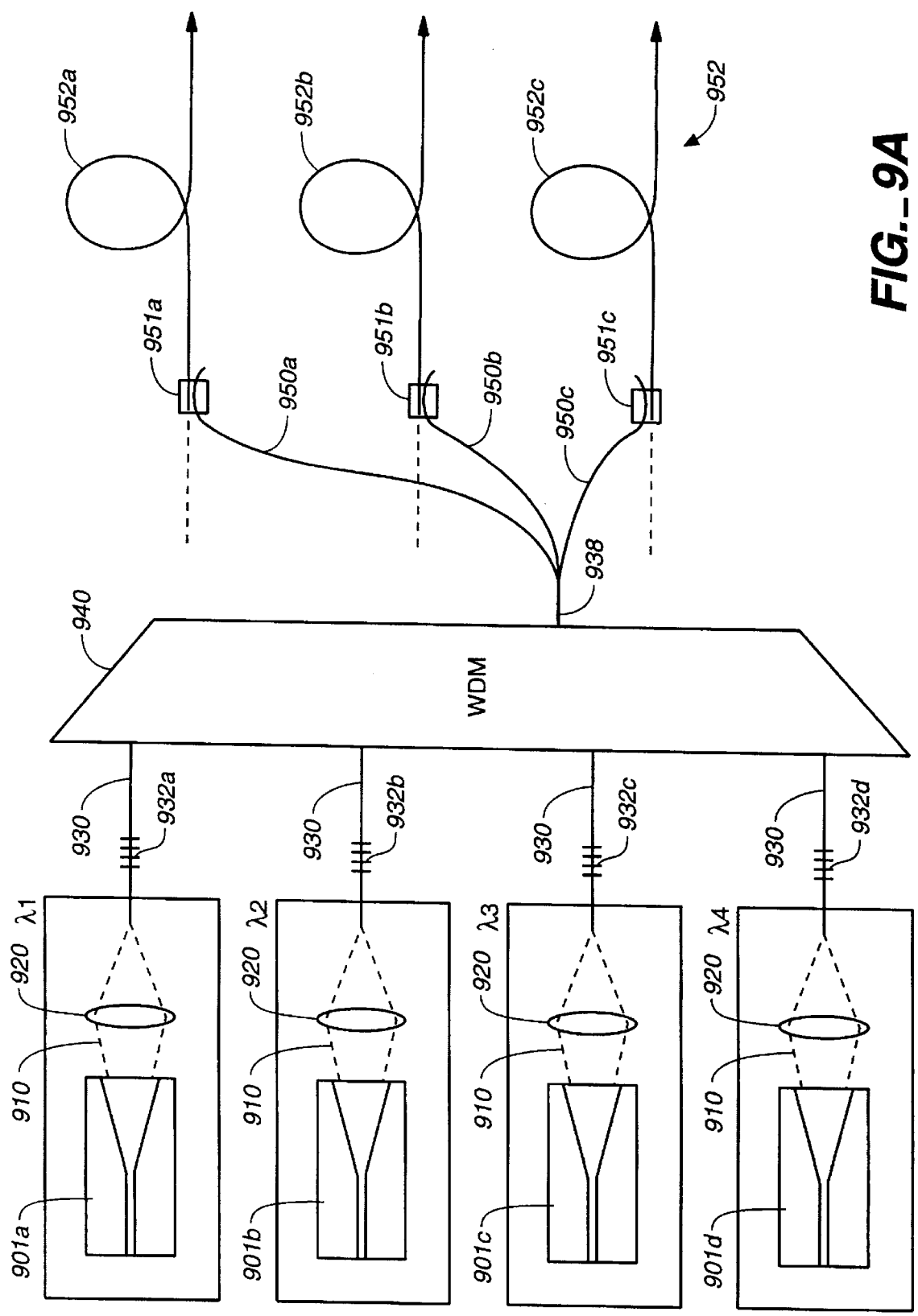
FIG._9A

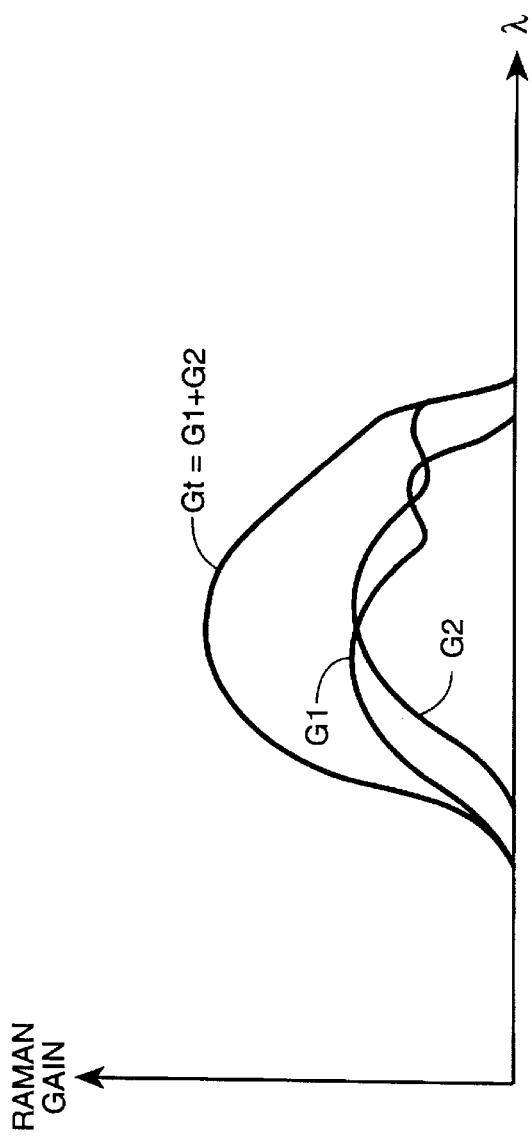
FIG._9B
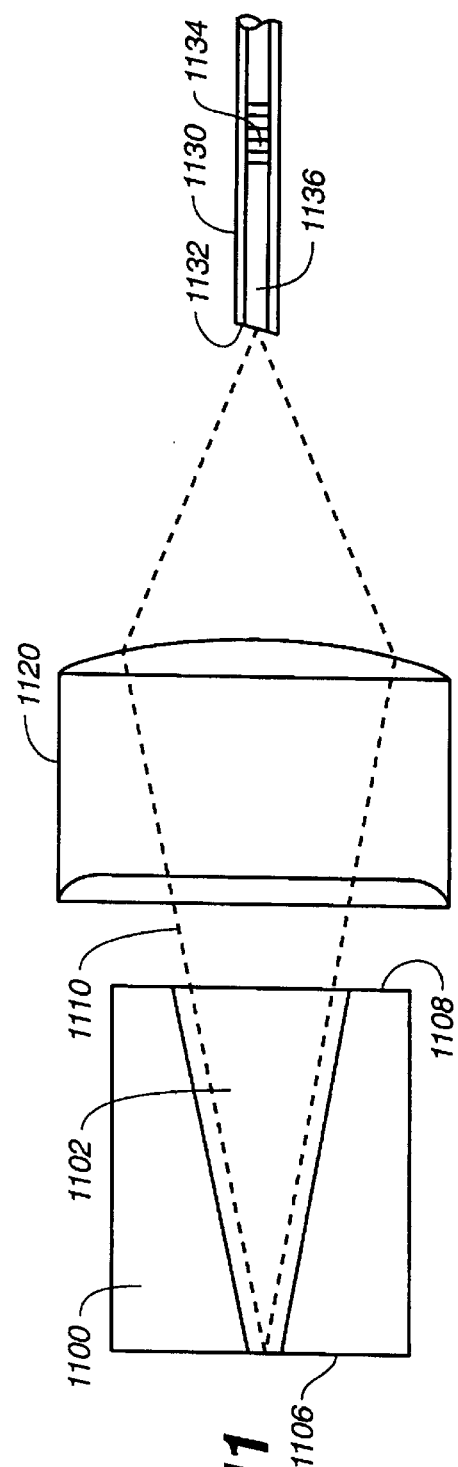
FIG._11

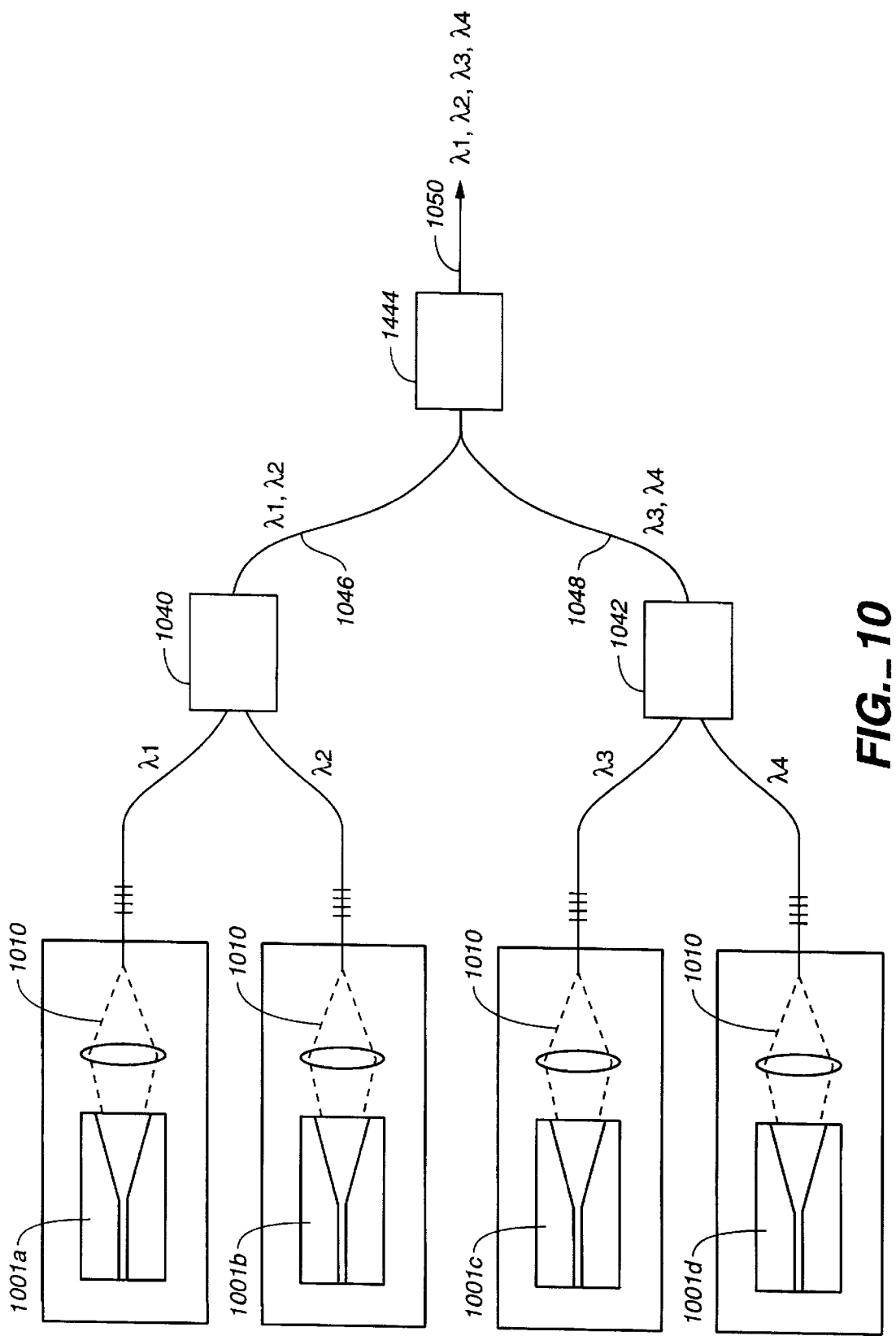
FIG._10

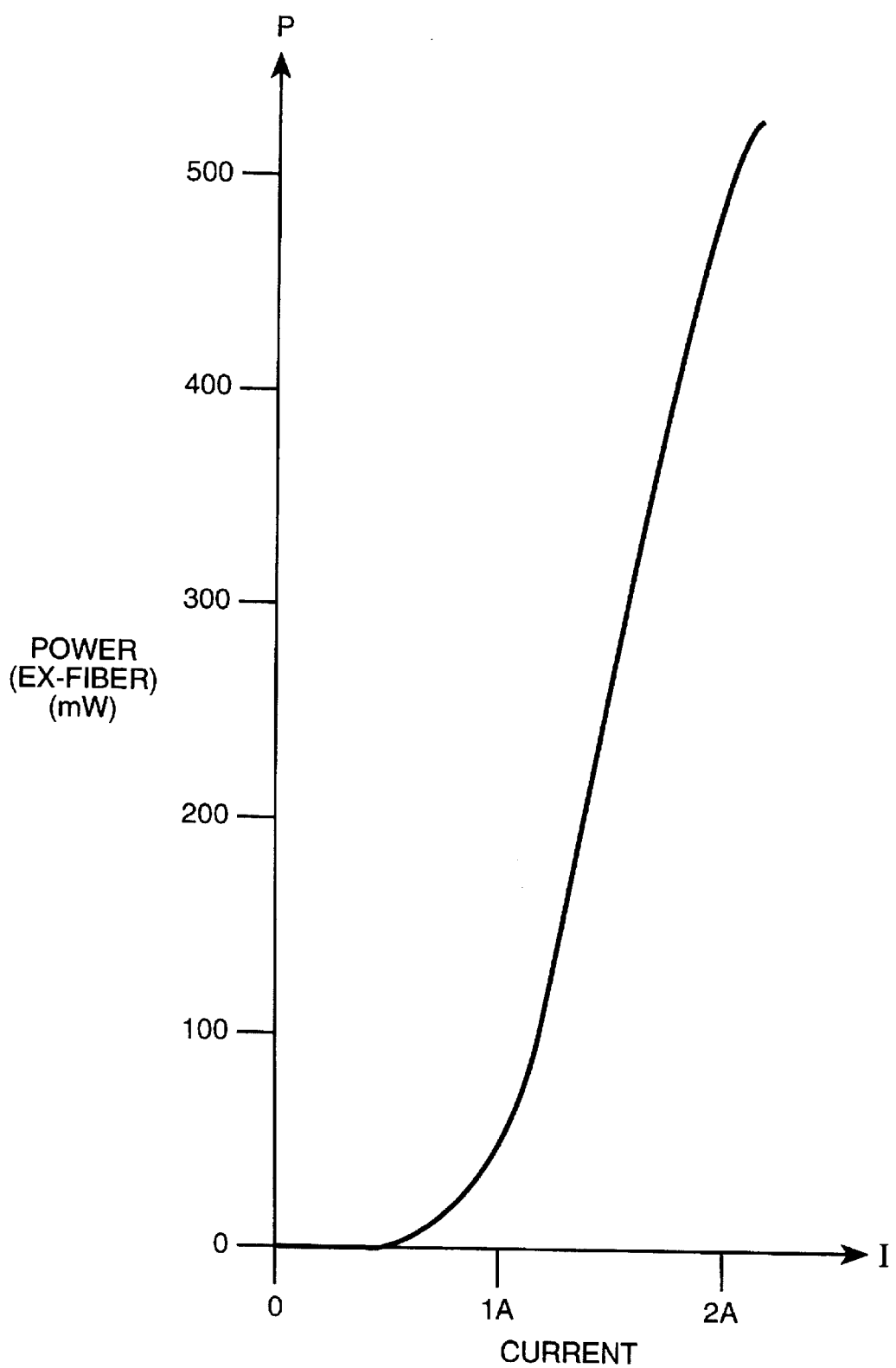
FIG._12

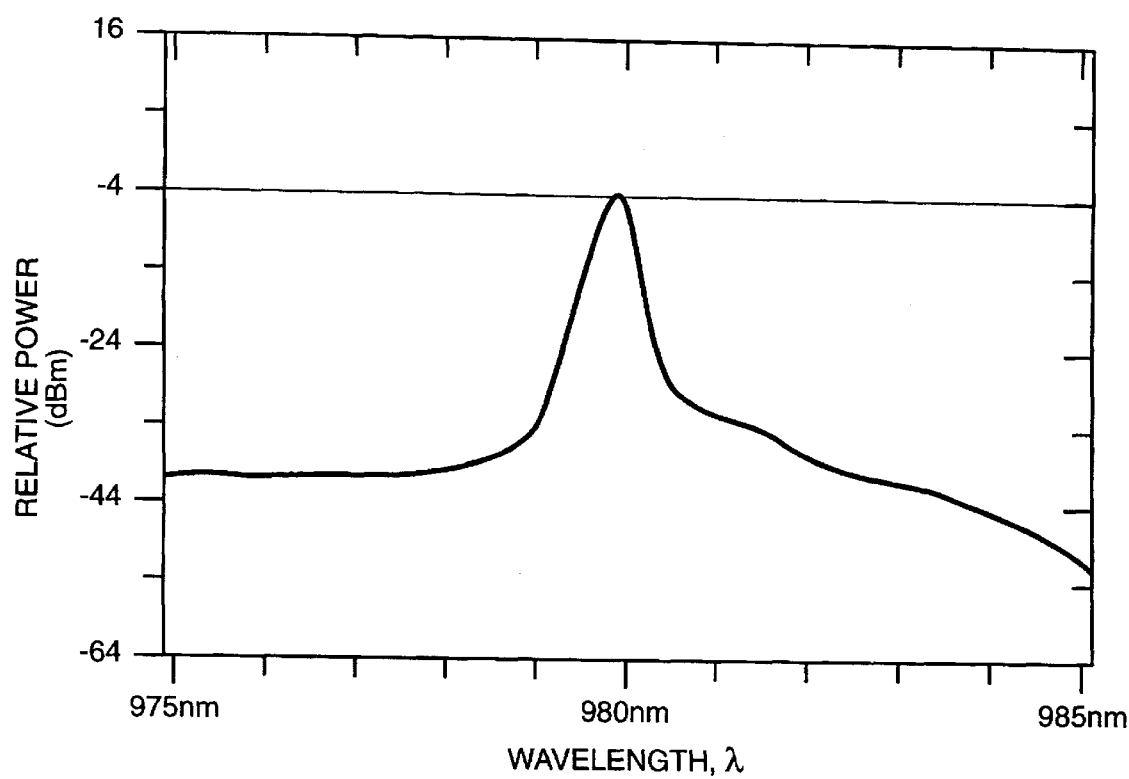
FIG._13
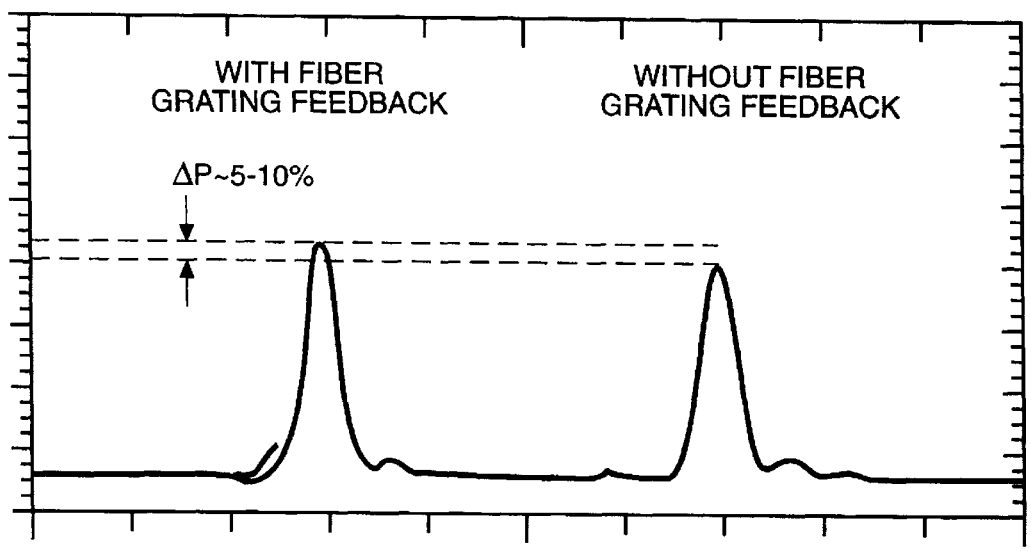
FIG._14

FIBER GRATING-STABILIZED, SEMICONDUCTOR PUMP SOURCE

RELATED APPLICATIONS

This is a continuation-in-part of provisional applications Serial Nos. 60/120,012, filed on Feb. 11, 1999 and 60/129,905, filed Apr. 16, 1999, and a continuation in part of non-provisional patent application Ser. No. 09/313,741, filed May 18, 1999.

FIELD OF THE INVENTION

The present invention relates to semiconductor laser diodes, and particularly to laser diodes with wavelength stabilized output.

BACKGROUND

Optical communications systems use fiber amplifiers that are optically pumped. Two such types of fiber amplifier are the erbium-doped fiber amplifier and the fiber Raman amplifier. The spectrum and output power of the laser should be stable, in order to maintain constant gain.

One problem, however, is that the pump power available from single transverse mode semiconductors is typically less than about 300 mW, and so obtaining higher pump powers requires combining the outputs of multiple lasers, which adds expense and complexity. Another problem is that conventional Fabry Perot or DFB lasers suffer from large fluctuations in output power and output spectrum that arise from changes in current or temperature. These fluctuations in output power and spectrum result in changes in the gain of the EDFA, and the amplitude of the communications signal becomes unstable. Stabilization of the pump wavelength is required for achieving both gain flatness and for obtaining higher pump power by wavelength division multiplexing (WDM) of several pump laser.

Another problem is the presence of nonlinear parasitic processes, such as stimulated Brillouin scattering (SBS), when the power level of the narrow linewidth light in the fiber becomes too high. The SBS threshold in a fiber for light from a DFB single-mode semiconductor laser, typically having a bandwidth of around 20 MHz, is generally in the range of 5 mW to 10 mW. These low SBS thresholds effectively cap the pump power deliverable from available sources, including single mode lasers, master oscillator/power amplifier (MOPA) systems, and even multimode lasers having a spectral intensity greater than about 10 mW per 20 MHz.

Therefore, there is a need for a high power laser for pumping fiber systems, such as amplifiers and lasers, that can deliver higher power than conventional single mode lasers, whose output is more stable in power and spectral content, and that overcomes the power limit set by parasitic nonlinear processes.

SUMMARY OF THE INVENTION

A semiconductor light source uses a flared gain section to provide increased power that is couplable into a single mode fiber. A frequency selective reflector, such as a fiber Bragg grating, may be used to provide feedback of the output from the semiconductor light source to induce coherence collapse of the output from the semiconductor light source. The light source may be used to provide high optical power levels within fibers for various fiber-based applications such as pumping fiber amplifiers or fiber lasers. A single such light source may be used in conjunction with multiple fiber applications. Multiple such light sources may be used together.

In one embodiment of the invention, a pump laser includes a semiconductor gain element having a first end and an output end, an optical gain region being disposed between the first end and the output end, a width of the optical gain region being greater at the output end than at the first end. The pump laser further includes an optical fiber having an input end and including a frequency-selective reflector to provide reflectance at a wavelength of light amplified in the optical gain region of the semiconductor gain element, and a light coupling system disposed to optically couple light from the output end of the gain element into the input end of the optical fiber.

Another embodiment of the invention is a semiconductor pump source having a semiconductor gain element with a rear facet and having a flared gain section, a wide end of the flared gain section being coupled to a front output facet of the gain element. An optical fiber has a first end, and a refractive index grating is formed in the optical fiber to provide reflectivity at a wavelength of light amplified in the semiconductor gain element. A light coupling system is disposed to optically couple light from the front facet of the gain element into the first end of the optical fiber. The refractive index grating has a reflectivity, and is disposed at a distance from the semiconductor gain element, both the reflectivity and the distance being selected for coherence collapse operation of the pump source.

Another embodiment of the invention is an optical fiber system that has a first pump laser and a first excitable fiber medium coupled to receive pump light from the first pump laser. The first pump laser includes a first semiconductor gain element having a first end and an output end, an optical gain region being disposed between the first end and the output end, a width of the optical gain region being greater at the output end than at the first end. A first optical fiber has an input end and includes a frequency-selective reflector to provide reflectance at a wavelength of light amplified in the optical gain region of the semiconductor gain element. A first lens system is disposed to optically couple light from the output end of the gain element into the input end of the first optical fiber.

In another embodiment of the invention, a semiconductor laser device includes a semiconductor gain element having a first end and an output end, an optical gain region being disposed between the first end and the output end, a width of the optical gain region being greater at the output end than at the first end. An optical fiber has an input end and includes a wavelength-selective reflector to provide reflectance at a wavelength of light amplified in the optical gain region of the semiconductor gain element. A light coupling system is disposed to optically couple light from the output end of the gain element into the input end of the optical fiber. A mode selective region is formed in the device for preferentially selecting a lowest order transverse mode.

In another embodiment of the invention, a semiconductor gain element has a first end and an output end, and an optical gain region is disposed between the first end and the output end. A width of the optical gain region is greater at the output end than at the first end. A light coupling system is disposed to optically couple light from the output end of the gain element into the input end of an optical fiber. An optical feedback element is disposed to feed light from the output end of the semiconductor gain element back into the semiconductor gain element. The optical feedback element preferentially feeds light back to the semiconductor gain element so that a coupling efficiency for light output from the output end and coupled into guided modes of the optical fiber is greater than 30%.

In another embodiment of the invention, a laser device includes a semiconductor amplifying means for amplifying light, having a first end and an output end wider than the first end. The laser device also includes an optical feedback means for reflecting light received from the output end of the semiconductor amplifying means, the optically reflecting means being reflective over a pre-selected wavelength range. A light coupling means couples light between the output end of the semiconductor amplifying means and the optically reflecting means. Light output from the semiconductor amplifying means is coherence collapsed.

The above summary of the present invention is not intended to describe each illustrated embodiment or every implementation of the present invention. Other objects and attainments, together with a fuller understanding of the invention will become apparent and appreciated by referring to the following description and claims taken in conjunction with the accompanying drawings.

BRIEF DESCRIPTION OF THE DRAWINGS

The invention may be more completely understood in consideration of the following detailed description of various embodiments of the invention in connection with the accompanying drawings, in which:

FIG. 1 illustrates an embodiment of an optical fiber communications system

FIG. 2 illustrates a semiconductor gain element having a flared amplifier region coupled to a single mode waveguiding region;

FIGS. 3A and 3B illustrate one approach to light coupling from a semiconductor gain element to a fiber having fiber grating according to an embodiment of the present invention;

FIG. 4 illustrates other approach to light coupling from a semiconductor gain element to a fiber having a fiber grating;

FIG. 5 illustrates another embodiment of a semiconductor gain element, having a flared gain section, being coupled to a fiber grating;

FIG. 6 illustrates an embodiment of a fiber laser pumped by a coherence-collapsed semiconductor laser;

FIGS. 7A and 7B illustrate different embodiments of cascaded fiber Raman lasers pumped by a coherence-collapsed semiconductor laser;

FIG. 8A illustrates an optical fiber system having multiple coherence-collapsed, high power lasers;

FIG. 8B illustrates an example of a pumping wavelength scheme for a Raman gain device using multiple pump sources;

FIG. 9 illustrates a fiber laser system having a wavelength multiplexed pump source;

FIG. 10 illustrates a fiber system having multiple pump lasers coupled to multiple fiber lasers;

FIG. 11 illustrates an embodiment of a semiconductor laser having a flared gain region coupled to a fiber;

FIG. 12 illustrates a graph of fiber light output v. current for a flared, unstable resonator (FUR) semiconductor laser in grating lock;

FIG. 13 illustrates the spectrum of a FUR semiconductor laser operating in grating lock; and FIG. 14 illustrates the far field beam patterns for a FUR semiconductor laser operating both with and without external fiber grating feedback.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to high power laser diode sources that are believed to be particularly useful for supplying optical power to fiber-based applications, such as pumping excitable fiber media, such as fiber lasers and fiber amplifiers.

FIG. 1 shows an example of a fiber-based optical communications system 100 having a transmitter unit 102 and a receiver unit 104 coupled by a fiber communications channel 106. The system may be based on the use of a single wavelength, or may be based on the use of multiple wavelengths of light. A common approach to using multiple wavelengths of light, referred to as WDM, is to multiplex signals at various wavelengths into a single multiplexed signal at a transmitter end and to demultiplex the various wavelength components at the receiver end. Dense WDM (DWDM) systems may also be used. As used herein, "WDM" includes DWDM.

The communications system 100 may be a WDM system, and the transmitter unit 102 may include a number of semiconductor laser transmitters 108-1, 108-2, ... 108-n operating at different wavelengths $\lambda 1, \lambda 2, \ldots, \lambda n$ respectively. The laser transmitters typically operate at a wavelength of around 1550 nm, although communications at other wavelengths are also possible. The light output from each laser transmitter 108-1, 108-2, ... 108-n is combined in a multiplexer 110 for transmission through the fiber channel 106. After propagating through the fiber channel 106, the multiplexed optical signal is received at the receiver unit 104. The light is split into its different wavelength components $\lambda 1, \lambda 2, \ldots, \lambda n$ in a demultiplexer 112, and each wavelength component is detected by a respective receiver 114-1, 114-2, ..., 114-n.

The fiber channel 106 may include multiple fibers, although only a single fiber is considered in the following description, for clarity. This should not be understood to limit the invention. Transmission losses within a fiber result in a reduction in the signal strength as the signal propagates between the transmitter and the receiver. Optical amplifiers are typically positioned along the fiber so that the signal, when it reaches the receiver, is sufficiently strong to reduce errors to an acceptable level. Two types of amplifier are contemplated in the figure. One type of amplifier is based on the use of a rare-earth doped fiber: erbium doped fiber amplifiers (EDFAs) are finding increasing use in fiber communications for amplifying optical signals at around 1550 nm. The fiber communications channel 106 may include one or more EDFAs. The figure shows two EDFA sections 116 and 118. Each EDFA section 116 and 118 is pumped with an EDFA pump 120, typically a semiconductor laser operating at a wavelength of around 980 nm that is coupled to the EDFA through a coupling fiber 122 and a fiber-fiber coupler 124.

Another type of amplifier is a Raman amplifier (RA) that uses Raman gain to amplify the optical signal. The figure shows two RA sections 126 and 128. The first RA section is positioned as a preamplifier before the second EDFA 118, and the second RA section is positioned as a preamplifier before the receiver unit 104. Each RA section 126 and 128 is pumped with a RA pump 130. Where the optical signal has a wavelength of about 1550 nm, the RA pump 130 is typically a semiconductor laser operating at a wavelength or around 1480 nm, depending on the type of fiber used for the RA section, which determines the Raman Stokes shift. The RA pump light is coupled from the RA pumps 130 to the RA sections 126 and 128 through coupling fibers 132 and fiber-fiber couplers 134.

Other types of amplifier may be used, including remote amplifiers that are positioned at a remote distance from the pump light. Overcoming SBS is an important problem for remote amplification and for distributed amplification systems.

We now discuss embodiments of semiconductor laser sources that are useful for pumping fiber devices, such as the EDFA pump 120 and the RA pump 130. The semiconductor laser sources of the present invention have an optical gain region disposed between a rear end and the output end. The width of the optical gain region is greater at the output end than at the rear end. In some embodiments, the width of the output end of the optical gain region is greater than 10 $\mu$m. In other embodiments, the width of the output end of the gain region is more than 40% larger than the width of the gain region at the rear end. The optical gain region may be index guided or gain guided, a combination of both, or unguided, at least in the lateral dimension. In some embodiments, the optical gain region may include a narrow, predominantly index-guided channel with lowest propagation loss for the fundamental mode. Such a channel may, but is not required to, introduce sufficient loss to the higher order modes only the fundamental mode oscillates. The channel is coupled to a flared gain region, permitting divergent propagation of light passing therethrough. The flared region may permit free, diffraction-limited divergent propagation, at least in one plane. The flared region may have some degree of optical confinement so that the divergence of light passing therethrough is less than freely diffraction limited. The flared region is typically confined in the vertical direction.

One example of a semiconductor laser source having an output end wider than the input end is illustrated in FIG. 2, which shows an unstable resonator semiconductor laser 200, described in U.S. Pat. Nos. 5,392,308 and 5,537,432 which are incorporated herein by reference. Such devices include a flared amplifier section 202 to provide amplification to high light levels, and a index-guided channel 204 that may function as a spatial mode filter. For example, a single spatial mode channel integrated with a flared amplifier can be used to produce a high power, diffraction limited light source. Thus, a high power may be obtained from a single semiconductor laser source. The figure is not intended to suggest limits on the relative lengths of the flared amplifier section 202 and the index-guided channel 204. The flared amplifier section 202 may be substantially longer in length than the channel 204, the flared amplifier section 202 may be substantially shorter than the channel 204, or they may adopt any intermediate ratio.

The rear facet 206 of the laser 200 is typically coated to have high reflectance (HR) and the front facet 208 is typically coated to provide a low reflectance (LR) and to permit the light generated in the laser 200 to exit from the front facet 208. A resonant cavity is formed between the facets 206 and 208, so that the laser 200 begins to oscillate when it is pumped above a threshold level, to produce an output 210. Most of the light 211 reflected within the semiconductor element from the front facet 208 continues to diverge after reflection, so that only a small portion of the light reflected at the front facet 208 actually returns to the index-guided channel 204 so as to provide feedback for laser oscillation. The laser 200 may be referred to as a flared unstable resonator (FUR).

Lasers that use gratings at the rear end of the laser for wavelength stabilization suffer from a number of problems when used for pumping fiber devices. First, a laser with a reflective grating on the semiconductor gain element, such as a distributed Bragg reflector (DBR) grating, produces a coherent output with a narrow linewidth, resulting in a low SBS threshold. In addition, a selective spectral filter for high power, flared semiconductor laser source has been suggested, employing a bulk grating or fiber grating positioned to couple light from the rear facet of the laser. The grating provides wavelength selective feedback functioning as a selective spatial mode filter, and permits stabilization or tuning of the operation of the flared amplifier section. This was reported in an article by Vincent V. Wong et al., entitled, "High-Power, Diffraction Limited InGaAsP Flared Unstable Resonators at 840 nm", 1997 Digest of the LEOS Summer Topical Meetings, pp. 74–75, Aug. 11–15, 1997, Montreal, Quebec, Canada. The geometry of a fiber grating aligned with the rear facet is not optimal for fiber pumping, since it requires coupling the laser to two fibers, namely the fiber coupled to the rear end of the device, and the fiber coupled to the output of the device. Coupling to two fibers is complex, reduces reliability, and increases losses, reducing efficiency. Furthermore, the laser may produce a coherent, narrow linewidth output which suffers from a low SBS threshold.

The output from a flared, unstable cavity semiconductor laser has been coupled to a single mode fiber, as is disclosed in S. Delepine et al., Electronics Letters Vol. 35, No. 2, Jan. 21, 1999. The fiber did not include any Bragg grating for external feedback to the laser. An isolator was inserted between the lenses of the collimating lens system to avoid feedback from the lenses and the input face of the fiber. Thus it was preferred to suffer the insertion losses of the isolator in order to avoid feedback to the laser. Up to 370 mW of light at 1480 nm was coupled into the fiber. However, the maximum power coupled into the fiber occurred at a power less than the maximum power of the laser, and was limited by a degradation in coupling efficiency that was explained by a degradation of the intensity profile of light emitted by the laser.

Thus, in this system, optical feedback was a problem to be avoided at the expense of the insertion losses of the isolator. Furthermore, the degradation in the far field beam profile limited the coupling efficiency, and also placed a limit on the absolute level of optical power that could be launched into the fiber.

One possible source of beam profile degradation in a high power device having a flared gain region is filamentation, as discussed in "1.1-W Continuous-Wave 1480 nm Semiconductor Lasers with Distributed Electrodes for Mode Shaping" by P. Salet et al., IEEE Photonics Technology Letters, vol. 10, pp. 1706–1708, 1998, incorporated by reference. Filamentation in an amplifier is particularly a problem when the light double passes the amplifier, as happens in a laser with a flared gain region, see "Spontaneous Filamentation in Broad-Area Diode Laser Amplifiers", R. J. Lang et al., IEEE Journal of Quantum Electronics, QE-30, pp. 685–694, 1994, incorporated herein by reference. The occurrence of filamentation may be reduced by reducing the nonlinearity of the amplifying medium, and by improving beam quality.

Stabilization of the laser 200 may be brought about by providing a fiber grating at the output side of the laser 200.

This is illustrated in FIGS. 3A and 3B, which show orthogonal views of a semiconductor FUR laser 300 whose output is coupled via a lens system 320 to a fiber 330. The laser 300 includes an index-guided channel 304 coupled at one end to a flared amplifier section 302. The other end of the channel 304 is terminated at the rear facet 306, where there is a high reflection coating. The wide end of the flared amplifier section 302 is terminated at the output end 308, where there is a low reflectivity coating. Light 310 transmitted through the output end 308 is coupled by the lens system 320 into the input end 332 of the fiber 330. The fiber 330 is typically a single mode fiber. Additionally, the fiber 330 may be of the polarization preserving type.

The fiber 330 includes a fiber Bragg grating (FBG) 334 that reflects sufficient light back to the laser 300 to cause coherence collapse. Coherence collapse is described in "Regimes of Feedback Effects in 1.5 μm Distributed Feedback Lasers" by R. W. Tkatch and A. R. Chraplyvy, Journal of Lightwave Technology, vol. LT-4, pp. 1655–1661, 1986, incorporated herein by reference, and in U.S. Pat. Nos. 5,484,481, 5,563,732 and 5,715,263, also incorporated herein by reference. In the coherence collapse regime, light from the laser is fed back into the laser cavity by an external reflector to perturb the laser spectrum. The onset of coherence collapse depends on several factors, including the reflectivity of the external reflector, the bandwidth of the external reflector, the separation between the external reflector and the laser and the coherence time of the laser.

Coherence collapse is characterized by a broad, time-averaged output spectrum, the width of which is related to the width of the reflectivity spectrum of the external reflector. The bandwidth of the coherence-collapsed output is broad, typically of the order of a GHz or more. This bandwidth is considerably broader than the single mode operation, typically around 20 MHz, of a conventional distributed feedback (DFB) semiconductor laser, or MOPA with a DFB oscillator. Furthermore, the spectral density of the coherence-collapsed output is significantly less than that of a multimode Fabry-Perot semiconductor laser, where the laser power is restricted to the narrow Fabry-Perot modes lying within the overall operating bandwidth. As a result, the onset of SBS in the fiber occurs at significantly higher power levels under coherence-collapse than when conventional DFB or Fabry-Perot lasers are used. Consequently, the coherence collapsed laser is able to operate at a level of hundreds, if not thousands, of mW, without SBS onset, which is many times higher than the SBS threshold for conventional, narrowband lasers.

The external reflector may be a fiber Bragg grating (FBG) within a fiber that is coupled to the laser output. The external reflector may also be some other type of reflector, for example a dielectric coating positioned on a substrate or an input face of a fiber, or some other suitable type of reflector that has a reflectance spectrum that may be selected to provide a desired coherence-collapsed laser output spectrum.

The reflectivity of the external reflector is typically less than 10%, for a position approximately within the range 0.5 m to 2 m from the laser, and preferably between 0.5 m and 1 m. The reflectivity of the external reflector is ideally selected to be as low as possible, in order to maximize throughput of the pump light to the fiber system, but should be sufficiently high to lock the laser to the FBG and initiate coherence collapse. On the other hand, too high a reflectivity may cause a reduction in the fiber coupling efficiency, thus reducing the output power in the fiber. Furthermore, too high a reflectivity may, for certain separation distances between the external reflector and the laser, prevent coherence-collapsed operation. It will be appreciated, therefore, that the reflectivity is selected to optimize the desired characteristics of the system.

Propagation of the light from the laser through the fiber may be subject to depolarization in the fiber, and so the distance between the fiber grating and the laser is should be reduced to reduce depolarization effects. On the other hand, positioning the external reflector close to the laser may result in narrow linewidth operation and/or produce mode-hopping instabilities.

In an example of a pump laser source of the type illustrated in FIGS. 3A, and 3B, a semiconductor gain element was fabricated using an $In_xGa_{1-x}As$ active region grown on a gallium arsenide (GaAs) substrate using metal organic chemical vapor deposition. The active region had two sections, a narrow single mode ridge waveguide section in the back that was coupled to a flared amplifier section. There was a single metal contact over the entire active region, and had a high reflectivity coating applied to the rear facet and an anti-reflection coating applied to the front facet. The laser operated at about 980 nm.

The measured light-current (L-I) characteristic of the device semiconductor device, with fiber coupling, is illustrated in FIG. 12. The threshold current was about 0.5 A, the slope efficiency was approximately 0.5 W/A, with a maximum continuous output power, through the fiber, of about 525 mW at a current of 2.12 A.

The laser output was coupled into a single mode fiber having a UV-written fiber Bragg grating having a reflectivity of about 10% at 980 nm, with a 3 dB bandwidth of approximately 1 nm. The separation between the laser and the grating was approximately 1 m. The laser locked to the fiber grating when the output was coupled into the fiber. The spectrum of the grating-locked laser output was measured to be around 1 nm, similar to the bandwidth of the fiber grating: the spectrum is illustrated in FIG. 13. The effective fraction of light fed back to the laser was adjustable by twisting the fiber using a polarization controller. The actual fraction of light fed back to the laser was not measured. The maximum percentage of light coupled through the fiber was over 56%.

The lateral far field beam quality was measured by imaging the collimated output from the laser, split off using a pellicle beam-splitter positioned between the second and third lenses 324 and 326 of the lens system 320. The far field beam quality was measured both with and without feedback from the fiber grating, the results of which are illustrated in FIG. 14. These measurements were made with the power through the fiber at about 80 mW. The far field beam quality was found to improve with fiber grating feedback: the power of the large central peak in the far-field beam profile increased by about 5–10%, resulting in a similar increase in the diffraction limited, central lobe. This increase in power took place when there was sufficient fiber grating feedback to lock the laser wavelength to the fiber grating.

Another semiconductor laser operating, at about 1485 nm, also showed an increase in the power of the central lobe in the output beam profile as a consequence of locking to a fiber grating. The laser had a threshold current of about 0.75 A, and coupled in excess of 525 mW through the fiber, corresponding to a coupling efficiency of more than 40%. This laser is further described in "Very High Power 1.48 μm Semiconductor Lasers", A. Mathur et al., Electronics Letters, vol. 35, no. 12, pp. 983–985, June 1999, and in "High Power Grating Stabilized 1480 nm Flared Semiconductor Pump Laser", A. Mathur et al., Tenth Optical Amplifiers and Their Applications, OSA Technical Digest (Optical Society of America), Washington D.C., 1999, pp. 263–266, both of which are incorporated by reference.

Therefore, in addition to inducing coherence collapse, an important result is that fiber grating feedback has an added advantage of improving the far field beam quality of a flared semiconductor laser. This results in an improved fiber coupling efficiency, which is particularly important at higher power levels. Thus the invention may be used to overcome, or at least extend, the limits of fiber coupling efficiency at high powers, disclosed by Delepine et al., and discussed above.

Coupling efficiency is generally defined as being the fraction of light coupled from the output of the semiconductor gain element into the guided mode of the fiber, or guided modes if the fiber is a multimode fiber. The coupling efficiency from the laser to the fiber may be greater than 30%, greater than 50% or, where the coupling optics are sufficiently close to being diffraction limited, may be higher than 70%.

An additional advantage provided by the fiber feedback is that the improved far field beam quality may reduce the likelihood of filamentation occurring in the laser at high power. One possible reason for this is that the feedback under coherence collapse is largely incoherent, as opposed to the coherent feedback suspected of inducing the optical nonlinearities that lead to filamentation, discussed in Lang et al., referenced above.

In the particular embodiment illustrated, the bandwidth of the output from the laser 300 is determined, at least in part, by the reflectance bandwidth of the FBG 334. The bandwidth of the FBG reflectance may be selected according to the particular application. For example, where the laser 300 being used to pump a rare earth-doped fiber amplifier, the FBG reflection bandwidth may be selected so that the bandwidth of the light output from the laser 300 matches the absorption bandwidth of the dopant rare earth ions.

Another advantage provided by control of the laser bandwidth by an external fiber grating is that, where the laser is used to pump a fiber amplifier, the stability of the spectrum of the pump light relative to the absorption spectrum of the fiber amplifier is increased, despite changes in current and temperature operation of the laser pumping the fiber amplifier. In conventional pump lasers, variations in the output spectrum arising from current or temperature changes may result in changes in pump power, which cause fluctuations in the amplitude of the optical communication signal. Since the spectrum of the coherence collapsed laser is characterized largely by the FBG, the temperature sensitivity of the output spectrum is determined by the fiber material, which is over ten times less sensitive to temperature than the semiconductor material of the laser. In contrast, conventional semiconductor lasers are typically subject to changes in the output spectrum resulting from a variety of effects, such as temperature change-induced mode-hopping, and long-term aging effects. Therefore, conventional semiconductor pump lasers may be particularly problematic for pumping rare-earth doped amplifiers, especially where the active species has a narrow absorption bandwidth.

The lens system 320 may have a number of lenses, or may include a single lens. The lens system 320 is used to direct the light 310 emerging from the laser into the fiber 330. The output 310 from the laser 300 is astigmatic. High optical coupling efficiency occurs when the lens system 320 corrects for the astigmatism by imaging, in the horizontal plane, the end 312 of the index-guided channel 304 to the core of the fiber 330, while imaging, in the vertical plane, the output of the vertically confining waveguide 314 to the fiber core. This focusing condition also results in efficient coupling of light reflected by the FBG 334 into the channel 304. The light fed back from the FBG 334 is imaged through the flared amplifier section 302 before reaching the channel 304.

The light 310 emerging from the laser 300 is astigmatic, since the focal planes for imaging in the horizontal and vertical planes are displaced from each other. Furthermore, the angle of divergence in the horizontal plane, parallel to the semiconductor junction, the x-z plane illustrated in FIG. 3A, is different from the angle of divergence in the plane perpendicular to the junction, the y-z plane illustrated in FIG. 3B. Therefore, the lens system 320 must have a different focusing power for the different planes, which requires that the lens system have a focusing element with a toroidal focusing power, i.e. it has a focal power in the x-z plane that is different from the focal power in the y-z plane. Therefore, a lens having a surface with a first radius of curvature in the x-z plane and a second radius of curvature in the y-z plane has a toroidal focusing power. A cylindrical lens, for which one of the radii of curvature is infinite, is considered to have a toroidal focusing power.

The lens system 320 illustrated in FIGS. 3A and 3B is a multiple lens system. The first lens 322 is a cylindrical lens used for collimating the output in the y-z plane. The second lens 324 is a cylindrical lens used for collimating the output in the x-z plane. The third lens is typically a non-toroidal lens, such as a spherical or aspherical lens, for focusing the collimated light 328 into the core of the fiber 330. The lens system 320 may be arranged so that the width of the beam 310 in the horizontal direction is approximately the same as the width of the beam 310 in the vertical direction, between the second and third lenses 324 and 326.

Other lens systems may be used, including a single lens 420, for example as illustrated in FIG. 4. Single lenses having a toroidal surface, suitable for focusing or collimating light from a FUR are discussed in U.S. Pat. No. 5,790,576, commonly assigned with the present application, and incorporated herein by reference. It will be appreciated that a number of different lens configurations and lens combinations may be used to obtain efficient optical coupling between the optical fiber and the FUR laser. Accordingly, the use of the term "lens system" is not intended to limit the number or type of lenses, but is intended to cover any optical system used to couple light from the FUR laser to the optical fiber.

The index-guided channel 304 may be omitted altogether. FIG. 11 shows a semiconductor laser 1100 whose output is coupled via a lens system 1120 to a fiber 1130. The laser 1100 includes a flared gain section 1102. The flared gain section 1102 is wider at the output end 1108 than at the rear end 1106. There is typically a high reflectivity coating on the rear end 1106 and an antireflection coating on the output end 1108. Light 1110 transmitted through the output end 1108 is coupled by the lens system 1120 into the input end 1132 of the fiber 1130. The fiber 1130 is provided with a FBG 1134 to provide feedback for coherence collapse. The fiber 1130 has a single mode core 1136. Therefore, light transmitted into the fiber core 1136 and reflected back from the FBG 1134 towards the laser 1100 is spatially filtered to be a single transverse mode. Thus the single mode fiber 1130 provides control over the spatial mode of the laser 1100, while the grating 1154 provides control over the spectral characteristics of the laser output. For optimum efficiency, the lens system 1120 focuses, in the horizontal plane, light from the fiber's input end 1132 on to the rear end 1106 of the laser 1100, to form a waist proximate the rear end 1106. The lens system 1120 focuses, in the vertical plane, light from the fiber's input end to the output face 1108 of the laser 1100. A result of this arrangement is that the component providing control of the single spatial output mode, the fiber 1130, is separated from the laser 1100.

Transverse mode selection may also be provided in the lens system. For example, the lens system may include a pin-hole or other aperture that filters out higher order modes. The lens system may also include a spatial filter. In another embodiment, there may be a plate positioned at a focus of the lens system, having a partially reflecting transparent region the focus, and which is opaque elsewhere. Such a plate may be used to filter transverse modes.

Thus, transverse mode selection may be provided on the gain element, in the lens system, or in the fiber. Transverse mode selection on the gain element may be provided by an index-guided channel, such as a single mode channel, coupled to the flared gain region. Transverse mode selection may also be provided by the core of the fiber, for example the single mode core of a single mode fiber. Transverse mode control may be provided in a combination of two or more of the gain element, the lens system and the fiber.

Another embodiment of a coherence-collapsed laser source is illustrated in FIG. 5. The laser source 500 includes a FUR laser 501 coupled to a first fiber 530 by a lens system 520. Unlike the examples presented above, there is no reflective element within the first fiber 530 in this embodiment. Instead, a coupler 532, operatively connected to the first fiber 530, is used to couple light from the first fiber 530 into a second fiber 534. The second fiber 534 includes a reflective element, such as a FBG 536. Light reflected by the reflective element 536 is fed back through the coupler 532 and the first fiber 530 to the laser 501. The reflectivity of the reflective element 536 and the separation distance between the laser 501 and the reflective element 536 may be selected to ensure that the laser 501 operates in the coherence collapse regime. An advantage of this embodiment is that the reflectivity or bandwidth of the reflecting element 536 may be changed without requiring alignment of the fiber 530 relative to the laser 501.

This embodiment is particularly useful where the feedback to the laser 501 is low. It is difficult to construct FBGs having a specific low reflectivity value, in part due to difficulties in measuring a low FBG reflectivity. This embodiment permits the use of a FBG 536 having a relatively high reflectivity, which is simpler to manufacture, and still achieves low feedback by using a coupler 532 that only directs a small portion of the light from the first fiber 530 to the second fiber 532. Since it is relatively straightforward to control the amount of light coupled to the second fiber 532 by the coupler 532, this embodiment permits low amounts of feedback.

A controller 540 is typically attached to the laser source 500. The controller may operate as a power supply, providing current to the laser 501. The controller may also stabilize the operating temperature of the laser 501. For example, the laser 501 may include a thermoelectric cooler, operated by the controller 540, to cool to the laser 501 to a specific operating temperature.

The first fiber 530 is optically connected to a fiber amplifier 550 by a second coupler 552. The fiber amplifier 550 may be, for example, part of an optical communications fiber link. The fiber amplifier 550 may be a rare-earth-doped fiber, a Raman fiber amplifier, or any other type of fiber amplifier. The fiber amplifier 550 may be separated from the coupler 552 by a large distance, in which case the fiber amplifier 550 is remote pumped.

Another application for a coherence-collapsed, flared gain semiconductor laser is pumping a fiber laser, as illustrated in FIG. 6. The laser system 600 includes a FUR laser 601 whose output 610 is optically coupled to a fiber 630 via a lens system 620. The fiber 630 includes a first FBG 632 that provides reflection at the wavelength of the pump light, $\lambda_p$, generated by the laser 501. The first FBG 632 enables the laser 601 to operate in the coherence-collapsed regime. The fiber 630 also includes two other FBGs 634 and 636, each providing reflectivity at the wavelength of the fiber laser, $\lambda_f$ The first laser FBG 634 may be a high reflectivity FBG in order to prevent light at $\lambda_f$ traveling back through the fiber 630 towards the laser 601. The second laser FBG 636 typically has a reflectivity lower than the reflectivity of the first laser FBG 634, and operates as the fiber laser output coupler. The section of laser fiber 638 between the two laser FBGs 634 and 636 is doped, typically with a rare earth material, such as erbium, yttrium, or some other dopable lasing species. The section of laser fiber 638 may also be co-doped with more than one lasing species.

Another application for a coherence-collapsed, flared gain semiconductor laser is pumping a cascaded Raman resonator (CRR), as illustrated in FIG. 7A. Cascaded Raman resonators are discussed in U.S. Pat. Nos. 4,036,106; 5,323,404; and 7,778,014, incorporated herein by reference. The laser system 700 includes a FUR laser 701 whose output 710 is optically coupled to a fiber 730 via a lens system 720. The fiber 730 includes a first FBG 732 that provides reflection at the wavelength of the pump light, $\lambda_p$, generated by the laser 701.

The fiber also includes a first set of two FBGs 734 and 736 to provide reflectivity at a first Raman wavelength, $\lambda_a$, separated from the pump wavelength $\lambda_p$ by the Stokes shift of the fiber core. Thus, if sufficient pump power is present within the resonator for $\lambda_a$, oscillation at $\lambda_a$ may take place in the first Raman resonator formed between the FBGs 734 and 736.

The fiber may also include a second set of FBGs 738 and 740 stacked between the first set of FBGs 734 and 736, where the second FBGs provide reflectivity at $\lambda_b$, which is separated from $\lambda_a$ by the Stokes shift of the fiber core. Therefore, $\lambda_b$ is separated from $\lambda_p$ by two Stokes shifts. This second Raman resonator, formed between the FBGs 738 and 740 oscillates when the light at the wavelength of $\lambda_a$ within the first Raman cavity reaches a sufficiently high intensity to overcome the threshold of the second Raman resonator.

It will be appreciated that additional Raman resonators may be added, stacked within each other, each successive resonator operating at a wavelength different from the previous resonator by an amount equal to the Stokes shift. The length of a Raman fiber resonator depends on the level of pump power.

The cascaded Raman resonators need not be physically stacked one within another. For example the FBG 740 may be placed outside the first Raman resonator formed between the FBGs 734 and 736. However, it is important that there is sufficient overlap between Raman resonators to provide sufficient Raman gain to enable oscillation to take place. Maximum efficiency is reached when the second Raman resonator is contained within the first Raman resonator.

In the embodiment illustrated in FIG. 7A, the first FBG 732, which provides reflectivity at $\lambda_p$ to ensure operation of the pump laser 701 in the coherence collapse region, is located on the other side of the cascaded Raman resonators from the laser 701. This need not be the case, and the first FBG 732 may be positioned closer to the output of the laser 701, for example as illustrated in FIG. 7B. The reflectivity selected for the first FBG 732 is dependent on the position of the first FBG 732. For example, if the first FBG 732 is positioned within approximately 0.1 to 1 m of the laser 701, in the configuration as shown in FIG. 7B, then the value of the grating reflectivity may be selected to be sufficiently low to ensure operation in the coherence collapsed mode.

A single pump laser may be used to pump one or more fiber devices. The embodiments described above show a single pump laser pumping a single fiber device. A single pump laser may, however, be used to pump multiple fiber devices, for example, a coupler positioned between the firs FBG 732 and the grating 734 may be used to couple a fraction of the light from the laser 701 into a second Raman laser, or some other fiber device. Thus, the output from the laser 701 may be to two or more fiber devices.

Furthermore, the output from multiple pump lasers may be combined into a single fiber to pump a fiber device with multiple pump sources. Such an arrangement provides certain advantages, for example increasing the pump power delivered to the fiber device, or delivering pump light having a specific spectrum not obtainable from a single pump source. It will be appreciated that multiple pump lasers may also be used to pump multiple fiber devices. The embodiments described below discuss some of the ways that multiple pump lasers may be used to pump fiber devices. The specific examples are intended to illustrate some of the configurations that may be used with the pump laser, and are not intended to limit the possible configurations. It will be appreciated that the embodiments presented below may be used with fiber devices different from those illustrated.

Multiple pump lasers are advantageous for pumping rare-earth-doped fiber devices because of the increased available pump power and because of the increased reliability resulting from redundant pump lasers. Multiple pump lasers are advantageous for pumping Raman-based fiber devices for similar reasons, and also because the use of multiple pump wavelengths permits the overall pump light spectrum to be tailored and dynamically controlled.

A combination of multiple laser sources, illustrated in FIG. 8, may be used, for example, for pumping one or more fiber devices, such as fiber lasers or fiber amplifiers. The scheme illustrated may be used with any number of pump lasers, and is shown for N pump lasers 801a, 801b, . . . 801n. The light 810 from each laser 801a, 801b, . . . 801n is focused by a respective lens system 820 into a respective fiber 830. Each fiber 830 includes an FBG 832a, 832b, . . . 832n to control each laser 801a, 801b, . . . 801n to operate in the coherence-collapsed regime at respective wavelengths $\lambda 1, \lambda 2, \ldots \lambda N$. Some, or all, of the respective wavelengths $\lambda 1, \lambda 2, \ldots \lambda N$ may be the same, or they all may be different. Light from the different lasers 801a, 801b, . . . 801n is combined in a combiner 840, to provide outputs that include a combination of light from each pump laser 801a, 801b, . . . 801n, or from some subcombination of the pump lasers 801a, 801b, . . . 801n. The combiner 840 may be any suitable type of combiner, for example, a star coupler, a WDM coupler, a stack of y-couplers, or the like.

The combiner 840 may have a single output, or may have multiple outputs. The embodiment illustrated has M outputs feeding to M different output fibers 850a, 850b, . . . 850m optically connected, via respective couplers 851a, 852b, . . . 852m, to respective fiber devices 852a, 852b, . . . 852m. The fiber devices 852a . . . 852m may be, for example, fiber lasers, including Fabry-Perot or DFB fiber lasers, or fiber amplifiers, at least some of which may be coupled to an optical communications system, or may be a combination of fiber lasers and fiber amplifiers. The output fibers 850a, 850b, . . . 850m themselves may include fiber devices, so that, for example, the output from the coupler 840 is fed directly into a number of fiber lasers.

Furthermore, one or more of the fiber devices 850a, 850b, . . . 850m may be a distributed feedback (DFB) fiber laser. The structure of a DFB fiber laser is different from a conventional laser that uses, for example mirrors or Bragg gratings, to provide localized feedback. The DFB fiber lasers include excitable fibers, for example rare-earth doped fibers. The doped fiber is overwritten with a FBG, so that the laser gain region extends through the fiber grating. The DFB-FBG typically has a $\lambda/4$ phase shift part way along the grating to increase output wavelength stability. An advantage provided by a fiber DFB is that the mode is more stable than, for example, a Fabry Perot fiber laser, which may suffer from mode hopping. Typically, fiber DFB lasers are limited in output power, because of the difficulty in generating an FBG that is longer than a few cm in length, and so a DFB fiber laser may be followed by a fiber amplifier section in order to boost power.

Fiber DFB laser and Fabry-Perot lasers that use a fiber FBG may be tuned, for example, by stretching that portion of the fiber containing the grating. The fiber medium polarization maintaining, or may be non-polarization maintaining.

Multiple lasers may be used for pumping multiple fiber lasers, as is illustrated in the embodiment shown in FIG. 9A. Here, the pump light is combined in a wavelength multiplexer. Four pump lasers are illustrated, but it will be appreciated that other numbers of pump lasers may be used.

Light 910 from pump lasers 901a, 901b, 901c and 901d is coupled into respective fibers 930 by respective lens systems 920. The fibers 930 include FBGs 932a, 932b, 932c, and 932d to control the lasers 901a, 901b, 901c and 901d to operate in the coherence-collapsed regime at respective wavelengths $\lambda 1, \lambda 2, \lambda 3,$ and $\lambda 4$. The output from each laser 901a, 901b 901c and 901d is combined in a WDM combiner 940 to provide light in an output 938 that includes light at $\lambda 1, \lambda 2, \lambda 3$ and $\lambda 4$.

Light from the output 938 is directed through one or more coupling fibers, for example coupling fibers 950a, 950b and 950c, to a number of fiber devices 952a, 952b and 952c respectively, through respective couplers 951a, 951b and 951c. Three fiber devices 952a, 952b and 952c are illustrated, but it will be appreciated that the light from the output 938 may be connected to other numbers of fiber devices 952. The fiber devices 952 may be excitable fiber devices, such as Raman-based devices or rare-earth-doped fiber devices. For example, the fiber devices 952 may be Raman amplifiers, each comprising a length of Raman excitable fiber, coupled to amplify signals received from an optical communications system. Such an arrangement is advantageous since it permits the spectrum of the pump light to be tailored to a desired spectrum.

This embodiment is advantageous, for example, for gain equalization because it provides a pump source operating at a number of discrete wavelengths, where the power level at each wavelength is independently adjustable relative to the power levels at the other wavelengths. This may be advantageous for tailoring the pump light spectrum a particular spectral profile, gain equalization, for compensating pump power depletion, and for dynamic pump control. For example, this embodiment may be advantageous for pumping Raman systems, as is further explained with reference to FIG. 9B. A Raman gain profile is associated with each of the pump wavelengths. The figure shows two Raman gain profiles, G1 and G2, that are associated with two different pump wavelengths, $\lambda 1$ and $\lambda 2$. Only two gain profiles GI and G2 are shown for clarity. It will be understood that a pump source with four pump wavelengths $\lambda 1, \lambda 2, \lambda 3$ and $\lambda 4$ will provide a total gain profile that is a combination of the gain profiles of each pump wavelength.

The shape of the individual Raman gain profiles G1 and G2 is essentially identical, but they are separated in wavelength by the difference between $\lambda 1$ and $\lambda 2$. The total Raman gain profile, Gt, is the sum of the gain profiles associated with each of the pump wavelengths. Therefore, for this example, Gt=G1+G2. By judicious selection of the pump wavelengths, the individual Raman gain profiles may be positioned so as to smooth out non-uniformities in the Raman gain. For example, the total gain profile Gt is smoother than the individual profiles GI and G2. Thus the overall Raman gain in a Raman amplifier or resonator may be tailored to be relatively flat over a particular wavelength range. Multiple pump wavelengths may be used to broaden the Raman gain: the total gain profile Gt has a broader bandwidth than a single individual Raman gain profile. The use of multiple, independent pump sources provides increased pump bandwidth, a flatter gain profile and permits dynamic control of the Raman gain.

Another embodiment using multiple lasers is illustrated in FIG. 10. In this embodiment, light from adjacent pairs of lasers of lasers is combined in stages with light from other laser pairs. The embodiment is illustrated for a four laser system, but other numbers of lasers may be used. Four lasers 1001a, 1001b, 1001c and 1001d each produce light at respective wavelengths $\lambda 1, \lambda 2, \lambda 3$, and $\lambda 4$. The light 1010 from the first two lasers 1001a and 1001b is combined in a first combiner 1040, to provide a combination of light at $\lambda 1$ and $\lambda 2$ in the output fiber 1046. The light from second pair of lasers 1001c and 1001d is combined in a second combiner 1042 to provide a combination of light at $\lambda 3$ and $\lambda 4$ in the output fiber 1048. Light from the two combiners 1040 and 1042 may then be combined in a third combiner 1044 to provide an optical output in fiber 1050 containing all four wavelengths $\lambda 1, \lambda 2, \lambda 3$, and $\lambda 4$.

An important advantage of the this embodiment, and the other multiple laser embodiments presented above, is that it permits redundancy to be built into the fiber system, thus permitting reliable long-term operation. The lasers need not all operate at different wavelengths. There may be sufficient power from less than four lasers to pump the fiber devices, with the remaining lasers held in reserve to replace any lasers that fail. It will be appreciated that some of the lasers 1001a . . . 1001d may operate at different wavelengths, with some degree of redundancy built in to the system, for example two lasers operating at different wavelengths, and each laser having a back-up operating at the same respective wavelengths.

While various examples were provided above, the present invention is not limited to the specifics of the examples. For example, it will be appreciated that in the embodiments described above, the semiconductor laser may be based on any suitable semiconductor material, including, but not limited to, InGaAs/GaAs and InGaAsP/InP devices. The fiber grating may be apodized on at least one of its ends, if not both ends, to eliminate spectral side lobes. Also, the fiber grating may be chirped. Any fiber grating in any of the embodiments may be tuned, for example by mechanically stretching the fiber, or through thermal expansion/contraction. Furthermore, the entrance face of the fiber may be flat, or may be curved to act as a lens. The entrance face of a fiber may be formed at a slight angle relative to the optical axis to prevent unwanted reflections feeding back along the optical axis.

As noted above, the present invention is applicable to semiconductor lasers. While having use in many different applications, it is believed to be particularly useful in providing a diffraction limited, high power, diffraction limited laser output suitable for pumping fiber amplifiers. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A semiconductor pump source, comprising:
   a semiconductor gain element having a rear facet and having a flared gain section, a wide end of the flared gain section being coupled to a front output facet of the gain element, an optical cavity being formed between the rear facet and the output facet;
   an optical fiber having a first end, a refractive index grating formed in the optical fiber to provide reflectivity at a wavelength of light amplified in the semiconductor gain element; and
   a light coupling system disposed to optically couple light from the front facet of the gain element into the first end of the optical fiber;
   wherein the refractive index grating has a reflectivity, and is disposed at a distance from the semiconductor gain element, both the reflectivity and the distance being selected for coherence collapse operation of the pump source.

2. A source as recited in claim 1, wherein the light coupling system is disposed to focus light from the first end of the optical fiber, in a plane parallel to a junction of the semiconductor gain element, to a region proximate a narrow end of the flared gain section.

3. A source as recited in claim 1, wherein the optical fiber is a polarization maintaining fiber.

4. A source as recited in claim 1, wherein the light coupling system includes an element having a toroidal focusing power.

5. A source as recited in claim 1, wherein the optical fiber is coupled to an excitable fiber gain medium.

6. A source as recited in claim 1, wherein the refractive index grating reflects light within a selected reflection bandwidth, and light from the semiconductor pump source has a spectral bandwidth approximately equal to the reflection bandwidth.

7. A source as recited in claim 1, wherein a fraction of light coupled from the gain element to the optical fiber is enhanced by feedback from the refractive index grating to the gain element.

8. A semiconductor light source, comprising:
   a semiconductor gain element having a first end and an output end, an optical gain region being disposed between the first end and the output end, a width of the optical gain region being greater at the output end than at the first end;

an optical fiber having an input end and including a wavelength-selective reflector to provide reflectance at a wavelength of light amplified in the optical gain region of the semiconductor gain element; and a light coupling system disposed to optically couple light from the output end of the gain element into the input end of the optical fiber.

9. A light source as recited in claim 8, wherein the width of the output end of the optical gain region is at least 30% greater than the width of the first end of the optical gain region.

10. A light source as recited in claim 8, wherein the width of the output of the optical gain region is greater than 10 microns.

11. A light source as recited in claim 8, wherein the wavelength-selective reflector is a Bragg fiber grating in the optical fiber.

12. A light source as recited in claim 8, wherein a reflectance value of the wavelength-selective reflector and a separation distance between the output end and the wavelength-selective reflector are selected to induce coherence collapse in light output from the gain element.

13. A light source as recited in claim 12, wherein the reflectance value of the wavelength-selective reflector is less than 10%.

14. A light source as recited in claim 12, wherein the separation distance between the output end and the wavelength-selective reflector is in the range 0.5 m to 2 m.

15. A light source as recited in claim 8, wherein the optical fiber is a polarization maintaining single mode fiber.

16. A light source as recited in claim 8, wherein the optical fiber has a second end optically coupled to an excitable fiber medium.

17. A light source as recited in claim 16, wherein the excitable fiber medium is a rare-earth doped fiber.

18. A light source as recited in claim 17, wherein the excitable fiber medium is a rare-earth doped fiber laser.

19. A light source as recited in claim 17, wherein the excitable fiber medium is a rare-earth doped fiber amplifier.

20. A light source as recited in claim 16, wherein light from the output end of the semiconductor gain element induces Raman gain in the excitable fiber medium.

21. A light source as recited in claim 20, wherein the excitable fiber medium is a fiber Raman amplifier.

22. A light source as recited in claim 20, wherein the excitable fiber medium is a fiber Raman resonator.

23. A light source as recited in claim 22, wherein the excitable fiber medium includes cascaded Raman resonators.

24. A light source as recited in claim 16, further including a fiber optic communications network coupled to the excitable fiber medium.

25. A light source as recited in claim 8, wherein the light coupling system includes at least one element having a toroidal focusing power.

26. A light source as recited in claim 25, wherein the at least one element having a toroidal focusing power includes a refracting surface having a toroidal surface profile.

27. A light source as recited in claim 8, wherein the optical gain region includes an index-guided channel having one end at the first end of the gain element, and a tapered gain region having a wide end at the output end of the gain element and having a narrow end coupled to another end of the index-guided channel.

28. A light source as recited in claim 8, wherein the refractive index grating reflects light within a selected reflection bandwidth, and light from the semiconductor pump source has a spectral bandwidth approximately equal to the reflection bandwidth.

29. A source as recited in claim 8, wherein a fraction of light coupled from the gain element to the optical fiber is enhanced by feedback from the refractive index grating to the gain element.

30. A light source as recited in claim 8, further comprising a controller coupled to supply current to the gain element and to stabilize gain element temperature.

31. An optical fiber system, comprising:

a first pump laser having a first semiconductor gain element having a first end and an output end, an optical gain region being disposed between the first end and the output end, a width of the optical gain region being greater at the output end than at the first end, a first optical fiber having an input end and including a frequency-selective reflector to provide reflectance at a wavelength of light amplified in the optical gain region of the semiconductor gain element, and a first lens system disposed to optically couple light from the output end of the gain element into the input end of the first optical fiber;

a first excitable fiber medium coupled to receive pump light from the first optical fiber.

32. An optical fiber system as recited in claim 31, further comprising an optical signal transmitter unit coupled to direct optical signals through the first excitable fiber medium and an optical signal detector unit coupled to detect optical signals after propagating through the first excitable fiber medium.

33. An optical fiber system as recited in claim 32, wherein the optical signal transmitter unit includes a plurality of optical transmitters operating at different wavelengths and a multiplexer coupled to receive optical signals from the plurality of optical transmitters, the multiplexer having an output coupled to direct a multiplexed output signal to the first excitable fiber medium.

34. An optical fiber system as recited in claim 32, wherein the optical signal detector unit includes a demultiplexer, coupled to receive a multiplexed signal from the first excitable fiber medium, and a plurality of detectors coupled to receive demultiplexed signals from the demultiplexer.

35. An optical fiber system as recited in claim 31, wherein the first excitable fiber medium includes a Raman gain medium.

36. An optical fiber system as recited in claim 35, wherein the first excitable fiber medium is a Raman amplifier.

37. An optical fiber system as recited in claim 35, wherein the first excitable fiber medium is a Raman laser.

38. An optical fiber system as recited in claim 31, wherein the first excitable fiber medium is a rare earth doped fiber amplifier.

39. An optical fiber system as recited in claim 31, wherein the first excitable fiber medium is a rare earth doped fiber laser.

40. An optical fiber system as recited in claim 31, further comprising a second pump laser having a second optical fiber, light output by the second pump laser propagating along the second optical fiber, and further comprising an optical light combiner coupled to receive light output from the first and second pump lasers and coupled to direct light from the first and second pump lasers to the first excitable fiber medium.

41. An optical fiber system as recited in claim 40, wherein pump light emitted by the first pump laser has a first wavelength different from the wavelength of the pump light emitted by the second pump laser.

42. An optical fiber system as recited in claim 40, wherein pump light emitted by the first pump laser has a first wavelength substantially similar to a wavelength of pump light emitted by the second pump laser.

43. An optical fiber system as recited in claim 40, further comprising an optical light splitter coupled to receive light from the first and second pump lasers and to direct light to the first and second excitable fiber media.

44. An optical fiber system as recited in claim 31, further comprising an optical light splitter coupled to receive light from the first pump laser, and a second excitable fiber medium, the first and second excitable fiber media being coupled to receive pump light from the optical light splitter.

45. A semiconductor laser device, comprising:
a semiconductor gain element having a first end and an output end, an optical gain region being disposed between the first end and the output end, a width of the optical gain region being greater at the output end than at the first end;
an optical fiber having an input end and including a wavelength-selective reflector to provide reflectance at a wavelength of light amplified in the optical gain region of the semiconductor gain element;
a light coupling system disposed to optically couple light from the output end of the gain element into the input end of the optical fiber; and
a mode selective region formed in the device for preferentially selecting a lowest order transverse mode.

46. A device as recited in claim 45, wherein the mode selective region is positioned in the semiconductor gain element.

47. A device as recited in claim 46, wherein the optical gain region includes a predominantly index guiding channel having one end at the first end of the semiconductor gain element and a tapered gain region having a wide end at the output end of the semiconductor gain element and having a narrow end coupled to the other end of the single mode channel, and the mode selective region comprises the single mode channel.

48. A device as recited in claim 45, wherein the mode selective region is positioned in the light coupling system.

49. A device as recited in claim 45, wherein the mode selective region includes the optical fiber.

50. A device as recited in claim 49, wherein the optical fiber is a single mode fiber having a fiber core, and the mode selective region further includes the fiber core.

51. A device as recited in claim 45, wherein the mode selective region is located in at least two of the semiconductor gain element, the light coupling system and the optical fiber.

52. A laser device, comprising
a semiconductor gain element having a first end and an output end, an optical gain region being disposed between the first end and the output end, a width of the optical gain region being greater at the output end than at the first end;
an optical fiber having an input end;
a light coupling system disposed to optically couple light from the output end of the gain element into the input end of the optical fiber; and
an optical feedback element disposed to feed light from the output end of the semiconductor gain element back into the semiconductor gain element, the optical feedback element preferentially feeding light back to the semiconductor gain element so that a coupling efficiency for light output from the output end and coupled into one or more guided modes of the optical fiber is greater than 30%.

53. A device as recited in claim 52, wherein the coupling efficiency from the semiconductor gain element to the propagation modes of the optical fiber is greater than 50%.

54. A device as recited in claim 52, wherein the coupling efficiency from the semiconductor gain element to the propagation modes of the optical fiber is greater than 70%.

55. A device as recited in claim 52, wherein the optical feedback element is wavelength selective and a spectrum of the light from the output end of the semiconductor gain element is substantially controlled by a reflectance spectrum of the optical feedback element.

56. A device as recited in claim 52, wherein the optical feedback element includes a reflector disposed with the optical fiber.

57. A device as recited in claim 56, wherein the reflector is a fiber Bragg grating formed within the optical fiber.

58. A device as recited in claim 52, wherein the optical feedback element induces coherence collapse in the laser device.

59. A laser device, comprising:
a semiconductor amplifying means for amplifying light, the amplifying means including a first end and an output end wider than the first end;
optical feedback means for reflecting light received from the output end of the semiconductor amplifying means, the optically reflecting means being reflective over a pre-selected wavelength range; and
light coupling means for coupling light between the output end of the semiconductor amplifying means and the optically reflecting means;
wherein light output from the semiconductor amplifying means is coherence collapsed.

* * * * *